United States Patent [19]

Yang

[11] Patent Number: 5,256,887
[45] Date of Patent: Oct. 26, 1993

[54] PHOTOVOLTAIC DEVICE INCLUDING A BORON DOPING PROFILE IN AN I-TYPE LAYER

[75] Inventor: Liyou Yang, Lawrenceville, N.J.

[73] Assignee: Solarex Corporation, Rockville, Md.

[21] Appl. No.: 733,172

[22] Filed: Jul. 19, 1991

[51] Int. Cl.$^5$ .................. H01L 27/14; H01L 31/00
[52] U.S. Cl. .................................. 257/53; 257/55; 257/458; 257/656; 136/258; 136/261
[58] Field of Search ............... 357/30 D, 30 J, 30 K, 357/2, 58, 30 R, 53, 55, 458, 656; 136/261, 258 AM, 249 TJ

[56] References Cited

U.S. PATENT DOCUMENTS

| | | | |
|---|---|---|---|
| 4,379,943 | 4/1983 | Yang et al. | 357/2 |
| 4,398,054 | 8/1983 | Madan | 136/255 |
| 4,581,476 | 4/1986 | Yamazaki | 136/258 |
| 4,681,984 | 7/1987 | Moeller | 357/30 J |
| 4,728,370 | 3/1988 | Ishii et al. | 357/30 K |
| 4,742,012 | 5/1988 | Matsumura et al. | 437/110 |
| 4,772,933 | 9/1988 | Schade | 357/2 |
| 4,784,702 | 11/1988 | Henri | 357/30 K |
| 5,032,884 | 7/1991 | Yamagishi et al. | 357/2 |
| 5,034,333 | 7/1991 | Kim | 357/30 J |
| 5,039,353 | 8/1991 | Schmitt | 357/30 J |

FOREIGN PATENT DOCUMENTS

| | | | |
|---|---|---|---|
| 60-257183 | 12/1985 | Japan | 136/258 AM |
| 61-222275 | 10/1986 | Japan | 357/2 |
| 1-164072 | 6/1989 | Japan | 136/258 AM |

OTHER PUBLICATIONS

Kondo et al., "Effects of low level doping of i-layer in a—SiC:H/a—Si:H heterojunction solar cells", IEEE-Oct. 1987, pp. 604–609.

Hack et al., "The Role of Boron Profiling in Enhancing the Performance of Amorphous Silicon Based Alloy P-I-N Solar Cells", 17th IEEE Photovoltaic Specialists Conference, Oct. 30, 1984, pp. 336–340.

Sichanugrist et al., "Amorphous Silicon Solar Cells with Graded Boron-Doped Active Layers", J. Appl. Phys., vol. 54, No. 1, Nov. 1983, pp. 6705–6707.

Sichanugrist et al., "Modeling and Experimental Performance of Amorphous Silicon Solar Cells with Graded Boron-Doped Active Layers", Solar Energy Materials, vol. 11, 1984, pp. 35–44.

Matsushita et al., "High Performance Hydrogenated Amorphous Si Solar Cells with Graded Boron-Doped Intrinsic Layers Prepared from Disilane at High Deposition Rates", Appl. Phys. Lett., vol. 44, No. 11, Jun. 1984, pp. 1092–1094.

Konagai et al., "Effect of Diborane Profile on the Photovoltaic Performance of A-Si:H Solar Cells Prepared by Glow Discharge of Disilane", 17th IEEE Photovoltaic Specialists Conference, Oct. 30, 1984, pp. 347–352.

Moeller et al., "Enhanced Stability of Amorphous Silicon pin Solar Cells by Doping Profiles", Mat. Res. Soc. Symp. Proc., vol. 49, 1985, pp. 325–330.

Moustakas et al., "Effect of Boron Compensation on the Photovoltaic Properties of Amorphous Silicon Solar Cells", Appl. Phys. Lett., vol. 43, No. 4, Aug. 1983, pp. 368–370.

Primary Examiner—William Mintel
Assistant Examiner—Minhloan Tran
Attorney, Agent, or Firm—Stephen G. Mican

[57] ABSTRACT

A photovoltaic cell for use in a single junction or multi-junction photovoltaic device, which includes a p-type layer of a semiconductor compound including silicon, an i-type layer of an amorphous semiconductor compound including silicon, and an n-type layer of a semiconductor compound including silicon formed on the i-type layer. The i-type layer including an undoped first sublayer formed on the p-type layer, and a boron-doped second sublayer formed on the first sublayer.

21 Claims, 4 Drawing Sheets

••••• CONTROL
○○○○○ BORON DOPED

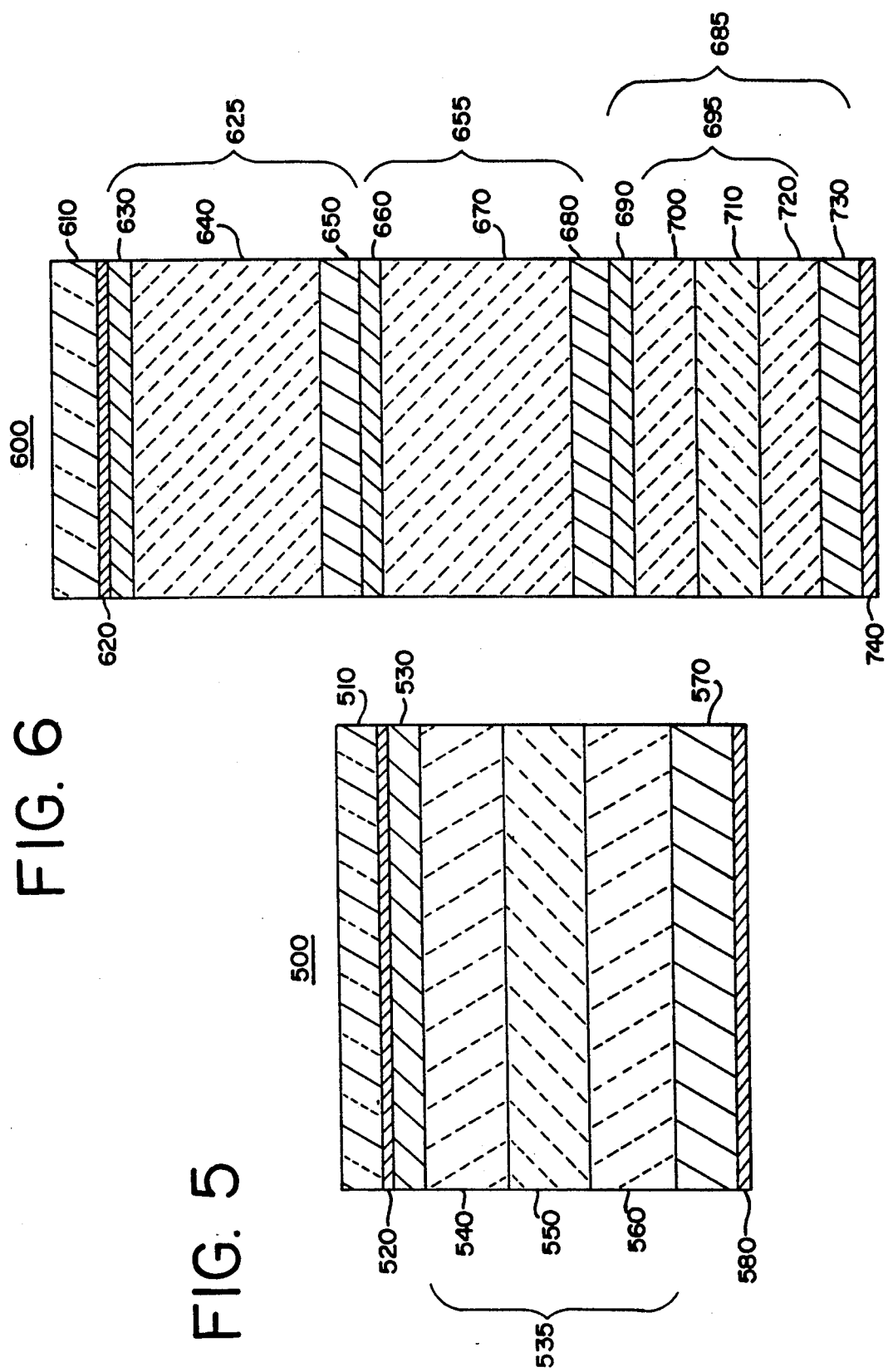

PHOTOVOLTAIC DEVICE INCLUDING A BORON DOPING PROFILE IN AN I-TYPE LAYER

BACKGROUND OF THE INVENTION

1. Field of the Invention

The present invention relates in general to photovoltaic devices and their method of manufacture. More particularly, the present invention relates to amorphous silicon photovoltaic devices constructed to have an improved efficiency.

2. Description of the Related Art

Photovoltaic (PV) devices are used to convert radiation, such as solar, incandescent, or fluorescent radiation, into electrical energy. This conversion is achieved as a result of what is known as the photovoltaic effect. When radiation strikes a PV device and is absorbed by an active region of the device, pairs of electrons and holes are generated. The electrons and holes are separated by an electric field built into the device.

In accordance with a known construction of solar cells using amorphous silicon, the built-in electric field is generated in a structure consisting of p-type, intrinsic (i-type) and n-type layers (p-i-n) of hydrogenated amorphous silicon (a-Si:H). In PV cells having this construction, the electron-hole pairs are produced in the i-type layer of the cell when radiation of the appropriate wavelength is absorbed. The separation of the electrons and holes occurs under the influence of the built-in electric field, with the electrons flowing toward the region of n-type conductivity and the holes flowing toward the region of p-type conductivity. This flow of electrons and holes creates the photovoltage and photocurrent of the PV cell.

It is important that the semiconductor material used for making a PV device is capable of absorbing and converting to useful electrical energy as much of the incident radiation as possible in order to generate a high yield of electrons and holes. In this regard, amorphous silicon is a desirable material for use in PV devices since it is capable of absorbing a high percentage of the incident radiation relative to other materials used in the construction of PV cells, such as polycrystalline silicon. In fact, amorphous silicon is capable of absorbing about 40% more of incident radiation than polycrystalline silicon.

The mobility ($\mu$) x lifetime ($\tau$) products of the photo-generated electrons and holes are also important characteristics for the semiconductor material used in a PV cell because small $\mu\tau$ products result in a greater number of electrons and holes that will recombine before being collected.

The structure of a p-i-n photovoltaic device 100 constructed in accordance with the prior art is shown in FIG. 1. PV device 100 includes a transparent substrate 110; a transparent conductive layer 120; a PV cell 125 having a p-type layer 130, an i-type layer 140, and an n-type layer 150; and a reflective conductive layer 160.

With respect to the above noted p-i-n type amorphous silicon PV cell 100 as presently known in the art, the undoped (intrinsic or i-type) layer 140 between p-type layer 130 and n-type layer 150 is proportionally much thicker than the p-type and n-type layers. The I-type layer 140 serves to prevent the radiation-generated electrons and holes from recombining before they can be separated by the built-in electric field. This structure is generally referred to as "p-i-n" if the radiation is incident on p-type layer 130, and "n-i-p" if the radiation is incident on n-type layer 150. However, the use of amorphous silicon as a photovoltaic material is still hampered by the relatively short lifetime of the photo-generated carriers in the i-type layer 140.

The performance of a PV device can, in part, be characterized by a quantum efficiency (QE), which is defined as the ratio of the number of electron-hole pairs actually collected, i.e., contributing to the generated photocurrent, to the number of incident photons.

The QE decreases as an external forward bias voltage is applied to the device causing a reduction in the built-in electric field. Thus, the ratio of the QE measured at a given forward bias to that at a short circuit condition (zero bias) indicates the effectiveness of the device for collecting photocarriers under a reduced built-in electric field. Furthermore, the QE varies as a function of the wavelength and can be measured as a function of the wavelength of the incident radiation which determines the average location where the electron-hole pairs are generated inside the PV device.

For example, the shorter wavelengths of the incident radiation, such as corresponding to blue light, are typically absorbed in i-type layer 140 near the outermost interface, i.e., the interface first encountered by the incident radiation (the p-i interface in the p-i-n PV device, and the n-i interface in the n-i-p PV device). The longer wavelengths, such as corresponding to red light, are absorbed uniformly in i-type layer 140 and thus cause a large fraction of photocarriers to be distributed between the midpoint thereof and the innermost interface of the PV device (the i-n interface in the p-i-n PV device, and the i-p interface in the n-i-p PV device). Thus, the longer the wavelength of the incident radiation, the greater the depth within i-type layer 140 at which the radiation is absorbed.

An amorphous silicon p-i-n type PV device having an i-type layer 140 that is not doped typically suffers from poor response to red light because the transport of holes under the weak electric field in the middle of i-type layer 140 is much poorer than that of electrons. Therefore, prior to the present invention, there have been efforts to modify the distribution of the built-in electric field across i-type layer 140 in order to improve the efficiency of the PV device, and in particular, the response to red light.

One known technique modifying for the distribution of the electric field across i-type layer 140 is to uniformly trace dope i-type layer 140 with boron. This technique is disclosed by T. D. Moustakas, H. P. Maruska, R. Friedman, and M. Hicks in their article "Effect of Boron Compensation on the Photovoltaic Properties of Amorphous Silicon Solar Cells" published in *Applied Physics Letters*, Vol. 43, No. 4, pp. 368-370, on Aug. 15, 1983. Because an undoped i-type layer 140 is normally slightly n-type, the electric field across such an undoped i-type layer is strongest near the p-i junction. By providing a level of uniform boron trace doping, i-type layer 140 becomes slightly p-type, thus moving the strongest region of the electric field nearer to the n-i junction. By adjusting the level of trace boron doping in this manner, the spectral response of the collection efficiency can be altered. However, because uniform boron trace doping results in regions in i-type layer 140 having strong electric fields, other regions of i-type layer 140 have relatively low electric fields.

In accordance with another known technique, low electric field regions in i-type layer 140 are minimized by providing a graded boron doping profile. Such a graded boron doping profile of i-type layer 140 is typically linear and has a decreasing concentration of boron from the p-i interface to the n-i interface. This technique is disclosed by P. Sichanugrist, M. Konagai, and Kiyoshi Takahashi in their article "Modeling and Experimental Performance of Amorphous Silicon Solar Cells with Graded Boron-Doped Active Layers" published in *Solar Energy Materials*, Vol. 11, pp. 35–44, in 1984. In accordance with this practice, i-type layer 140 is doped with boron with a graded profile extending between the p-i and n-i interfaces such that it is slightly p-type at the p-i interface and slightly n-type at the n-i interface. As a result, the electric fields at the interfaces are reduced and the built-in electric field is more uniformly distributed throughout i-type layer 140. By providing a uniform electric field throughout i-type layer 140, the regions having low electric fields are minimized, as is the likelihood that the electrons and holes traveling through such regions will recombine.

The above described techniques have been adopted based on the belief that the electric field distribution in the i-type layer needs to be modified. However, none of the above techniques based on this belief have resulted in an amorphous silicon PV device with a significantly increased overall efficiency.

Further, the present inventor has observed that the above described techniques involve doping i-type layer 140 proximate the p-i interface which, disadvantageously, results in a decrease in the electric field at the p-i interface. A decrease in the electric field at the p-i interface in a p-i-n type PV device results in a decrease in its response to blue light. This is because blue light is absorbed in the region near the p-i interface and electrons generated by the blue light may not be subjected to a sufficiently strong electric field in that region to cause them to travel the entire width of i-type layer 140 to be collected at n-type layer 150. Thus, although the above described techniques may provide an improved response to red light as compared to an amorphous silicon PV device having an undoped i-type layer 140, the response to blue light and the overall efficiency of the PV device is actually reduced.

SUMMARY OF THE INVENTION

The present invention has been made in view of the above circumstances and has as an object to provide an amorphous silicon photovoltaic device having an increased overall efficiency.

A further object of the present invention is to provide a photovoltaic device having improved red light response as represented by a higher forward to zero bias QE ratio throughout the 560–1,000 nm spectral range.

Another object of the present invention is to provide an amorphous silicon photovoltaic device having a novel boron doping profile.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, a photovoltaic cell comprises a p-type layer of a semiconductor compound including silicon; an i-type layer of an amorphous semiconductor compound including silicon, the i-type layer including an undoped first sublayer formed on the p-type layer, and a doped second sublayer formed on the first sublayer; and an n-type layer of a semiconductor compound including silicon and formed on the i-type layer.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIG. 5 is a cross-sectional view of a photovoltaic device constructed in accordance with a second embodiment of the present invention; and FIG. 6 is a cross-sectional view of a multijunction photovoltaic device constructed in accordance with the present invention.

DETAILED DESCRIPTION OF THE PREFERRED EMBODIMENTS

Reference will now be made in detail to the present preferred embodiments of the invention, an example of which is illustrated in the accompanying drawings.

As discussed above, the techniques used to increase the efficiency of an amorphous silicon PV cell are all based on the belief that the distribution of the electric field in the i-type layer needs to be modified. However, the present inventor has discovered that low-level boron doping can significantly improve the lifetime of the holes in the i-type layer. Therefore, an object of the present invention is to improve the transport of holes in the middle of the i-type layer by increasing the lifetime of holes instead of modifying the electric field in this region.

A PV device constructed in accordance with the present invention is of the p-i-n or n-i-p type and includes an i-type layer having an undoped portion between the p-i interface and a doped portion of the i-type layer so that the electric field and the electron lifetime at the p-i interface where blue light is absorbed, are not reduced. As a result, the benefits of doping a portion of the i-type layer to increase the response of the PV device to red light can be realized without significantly reducing its response to blue light.

Figure 1:
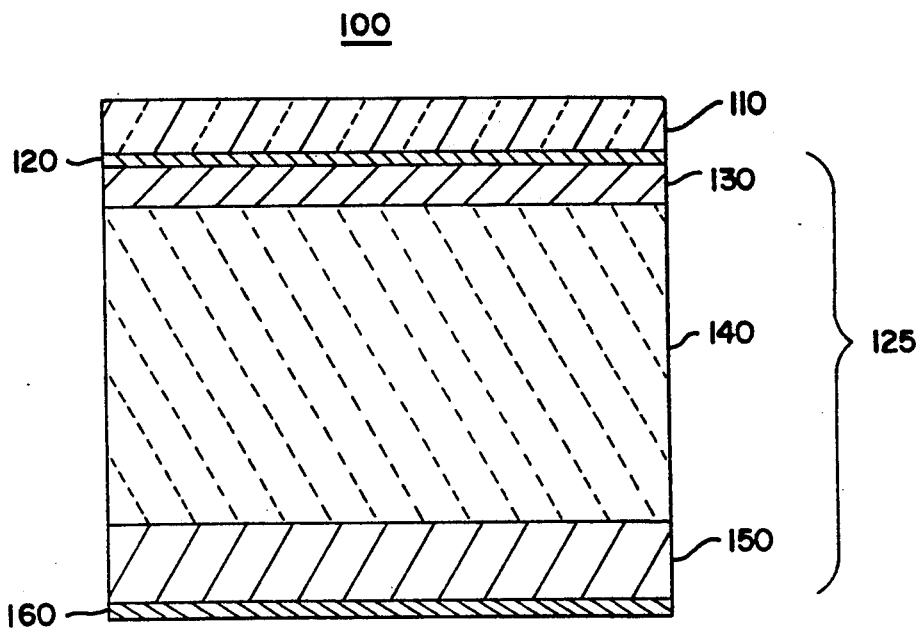
FIG. 1 is a cross-sectional view of a photovoltaic device constructed in accordance with the prior art.
Figure 2:
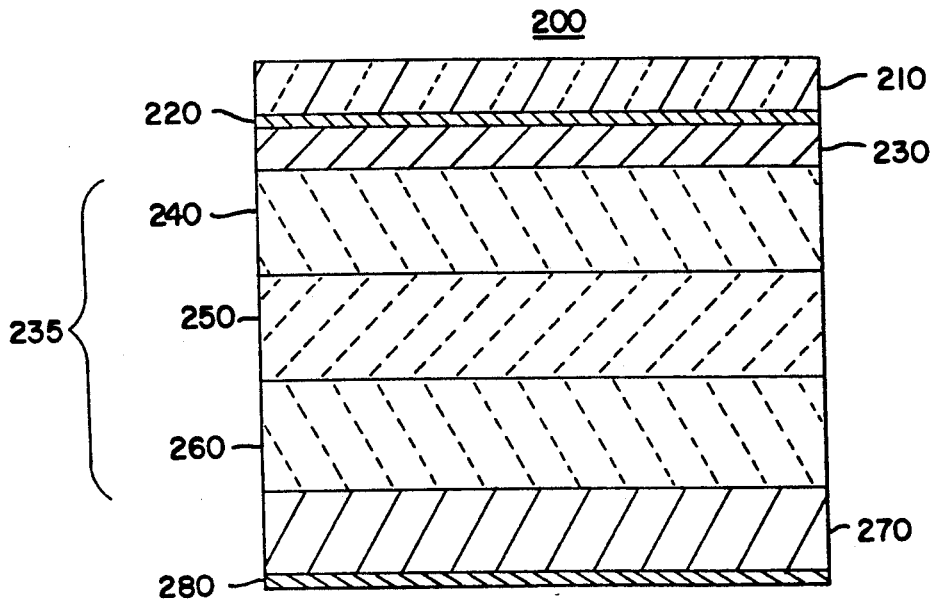
FIG. 2 is a cross-sectional view of a photovoltaic device constructed in accordance with a first embodiment of the present invention.

FIG. 2 shows a cross-sectional view of a p-i-n PV device 200 constructed in accordance with a first embodiment of the present invention. PV device 200 includes a transparent substrate 210, a transparent conductive layer 220, a p-type layer 230, and an i-type layer 235 consisting of an undoped first sublayer 240, a borondoped second sublayer 250, and an undoped third sublayer 260. PV device 200 further includes an n-type layer 270 and a reflective conductive layer 280.

Transparent substrate 210 may be comprised of any material transparent to the radiation to which the PV device will be subjected, the preferred material being glass. Transparent conductive layer 220 is formed by coating a thin film of a transparent conductive oxide, such as tin oxide, on transparent substrate 210 using the chemical vapor deposition (CVD) technique. P-type layer 230 is deposited on transparent conductive layer 220 using DC plasma-assisted chemical vapor deposition. Preferably, p-type layer 230 comprises SiC containing a uniform boron concentration on the order of $5 \times 10^{19}$ atoms/cm$^3$, and a thickness in the range of 100 to 120 Å. To obtain the preferred p-type layer 230, a mixture of $SiH_4 + CH_4 + B_2H_6$ is used as the source gas, which has a flow rate set at 200 sccm/min.

After the deposition of p-type layer 230, the deposition process is terminated and followed by a long flush (approximately 20 min.) using the gas mixture to be used for the deposition of undoped first sublayer 240 of i-type layer 235. This flush eliminates the possibility of residual boron contamination in the deposition of the i-type layer 235. The i-type layer 235 is then deposited on p-type layer 230 using DC plasma-assisted chemical vapor deposition. The i-type layer 235 may be formed of any one of various compounds of amorphous silicon (a-Si) such as $a-Si_{1-x}Ge_x:H$ or $a-Si_{1-x}C_x:H$, but is preferably formed of a-Si:H. To form i-type layer 235 of a-Si:H, $SiH_4$ at a flow rate approximately 200 sccm/min is used as the source gas mixture. Undoped first sublayer 240 of i-type layer 235 is deposited on p-type layer 230 until it reaches a thickness between 500 to 3,000 Å, at which point the plasma deposition is interrupted.

To form boron-doped second sublayer 250, the plasma deposition is resumed wherein a low flow of a boron containing gas such as $B_2H_6$, $BF_3$, or, preferably, $B(CH_3)_3$, is mixed with the $SiH_4$ source gas mixture. The flow of the boron containing gas may be varied during the deposition of boron-doped sublayer 250 in order to produce a graded doping profile. However, it is preferred to maintain the flow of the boron containing gas substantially constant. The boron doping concentration ranges up to $5 \times 10^{17}$ atoms/cm$^3$, and is preferably $2 \times 10^{16}$ atoms/cm$^3$. To obtain this boron doping concentration the flow rate of the $SiH_4$ source gas is set at 200 sccm/min, and the flow rate of the boron source gas is set at $5 \times 10^{-5}$ sccm/min. When boron-doped second sublayer 250 reaches a thickness in the range of 500 to 4000 Å, the flow of the boron containing gas is stopped, and the deposition using the $SiH_4$ source gas mixture for the i-type layer continues in order to form undoped third sublayer 260. The flow rate of the $SiH_4$ source gas for undoped third sublayer 260 is set at 200 sccm/min. The deposition of undoped third sublayer 260 is stopped when the overall thickness of the i-type layer reaches the desired overall thickness which is in the range of 2,000 to 10,000 Å. The thickness of undoped third sublayer is in the range of 0 to 3,000 Å.

After completion of the deposition of i-type layer 235, n-type layer 270 is deposited on i-type layer 235 using DC plasma-assisted chemical vapor deposition. N-type layer 270 may be formed of a semiconductor material including hydrogenated amorphous silicon and phosphorous. The source gas mixture to form n-type layer 270 preferably consists of $SiH_4$ and $PH_3$, having respective flow rates of 220 sccm/min. and 5 sccm/min.

When the thickness of n-type layer 270 reaches 200 to 300 Å, the deposition of n-type layer 270 is completed.

After the deposition of n-type layer 270 is completed, reflective conductive layer 280 is deposited on n-type layer 270. Reflective conductive layer 280 comprises a dielectric/metal reflective material, such as ITO/Ag, and has a thickness of approximately 2000 Å. The ITO/Ag layer may be formed by electron beam evaporation.

An example of a photovoltaic device constructed in accordance with this embodiment, includes: a glass substrate having a thin 7,000 Å tin oxide coating formed on one side to serve as a transparent conductive layer and a p-type SiC boron-doped layer having a thickness of 100 Å formed on the tin oxide coating; an i-type layer, formed on the p-type layer, having an overall thickness of 5,000 Å and having first, second, and third sublayers each having a thickness of approximately 1673 Å; an n-type layer, formed on the i-type layer having a thickness of 200 Å; and a reflective conductive layer, deposited on the n-type layer, having a thickness of approximately 2000 Å.

Figure 3:
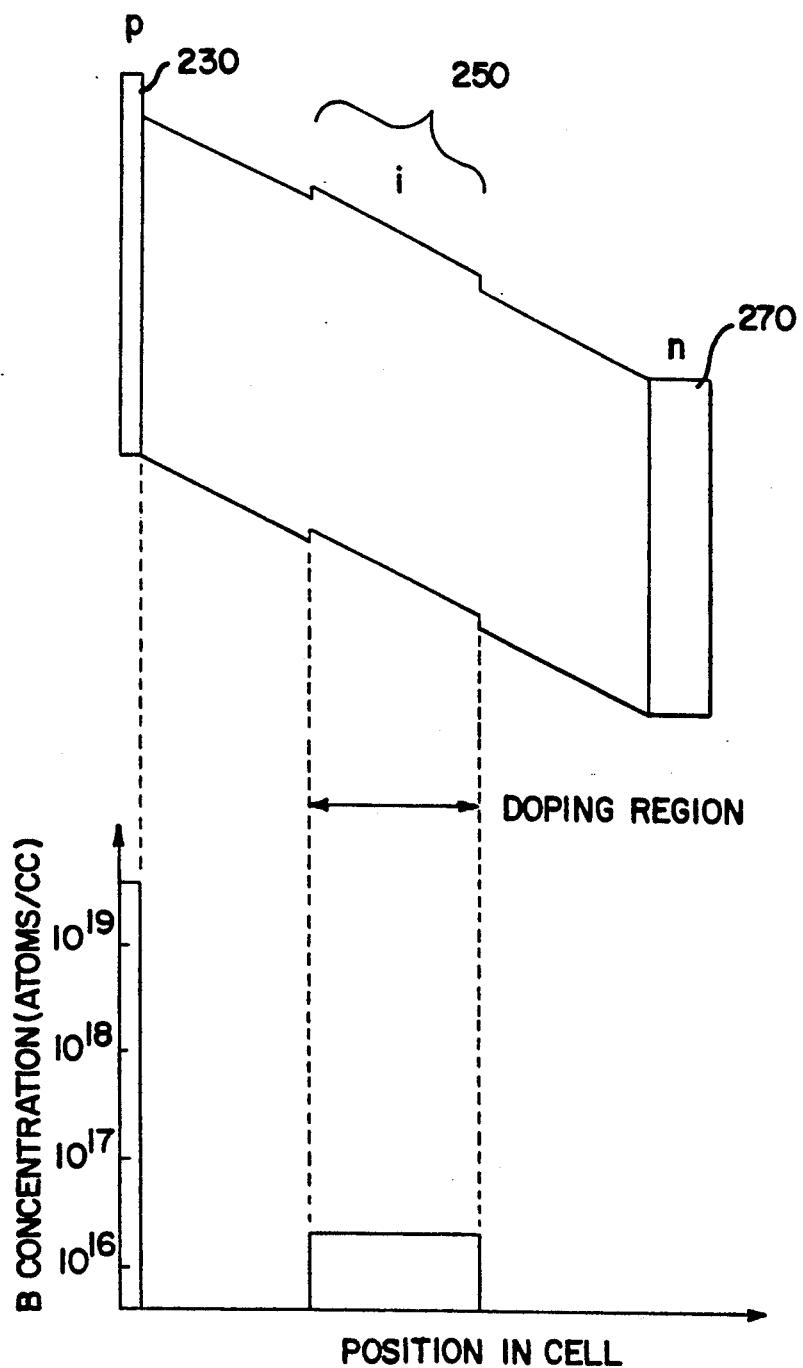
FIG. 3 is a graph showing the doping concentration of boron in an i-type layer in the photovoltaic cell shown in FIG. 2; and the corresponding energy band diagram.

FIG. 3 shows an exemplary profile of the doping concentration of boron relative to the position in the photovoltaic cell shown in FIG. 2. As is apparent from FIG. 3, only p-type layer 230 and boron-doped second sublayer 250 are doped with boron, and the boron doping concentration of p-type layer 230 is much higher than the boron doping concentration of boron-doped second sublayer 250.

Figure 4:
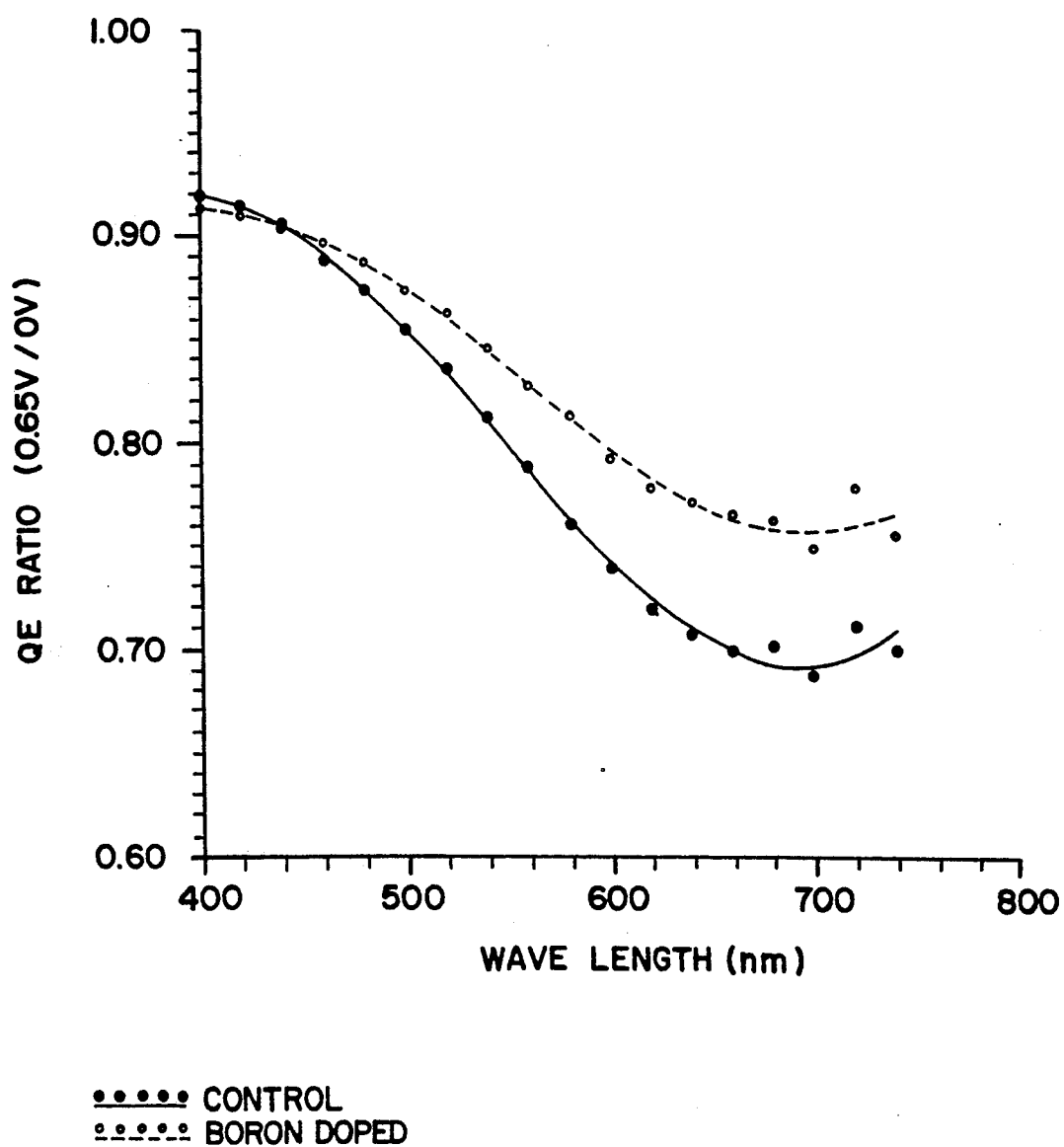
FIG. 4 is a graph showing quantum efficiency ratio as a function of the wavelength of incident radiation for the photovoltaic device shown in FIG. 2 and for a photovoltaic device having an undoped i-type layer.

FIG. 4 is a graph showing the quantum efficiency ratio plotted as a function of the wavelength of incident light for the photovoltaic device shown in FIG. 2 (solid line) and for a photovoltaic device, serving as a control for comparison purposes, having an undoped i-type layer (broken line). As seen in the graph, the photovoltaic device having the structure shown in FIG. 2 has a clearly improved quantum efficiency ratio for the longer wavelengths.

Table 1 lists the device parameters of two pairs of actually constructed PV devices. Each pair included a control cell made without any boron doping in the i-type layer, and a photovoltaic cell having the structure shown in FIG. 2 including a uniform 0.4 ppm boron doping in boron-doped second sublayer 250 of i-type layer 235. The i-type layers of the devices had a thickness of approximately 5400 Å, in which the middle one-third of the layers were doped with boron to a concentration of approximately $2 \times 10^{16}$ atoms/cm$^3$. The pairs of PV devices were made consecutively within the processing apparatus to minimize any differences that could otherwise result from variations occurring in fabrication.

TABLE 1

| Cell # | | $V_{oc}$ (V) | $J_{sc}$ (mA/cm$^2$) | F.F. | $\eta$ |
| --- | --- | --- | --- | --- | --- |
| 1. | Control | 0.85 | 16.4 | 0.64 | 8.9% |
| 2. | w/boron | 0.86 | 17.1 | 0.66 | 9.7% |
| 3. | Control | 0.85 | 16.1 | 0.64 | 8.8% |
| 4. | w/boron | 0.84 | 16.9 | 0.67 | 9.5% |

As is apparent from Table 1, cell #,s 2 and 4 made in accordance with the present invention exhibited significant improvements in the short circuit current density $J_{sc}$, fill factor F. F., and overall efficiency $\eta$. As used herein, the fill factor F. F. of the PV device is defined as the ratio $V_{mp}I_{mp}/I_{sc}V_{oc}$, where $V_{mp}$ and $I_{mp}$ are respectively the voltage and current at maximum power delivery of the PV cell, and $V_{oc}$ and $I_{sc}$ are respectively the maximum voltage and current achievable in the PV cell. The efficiency $\eta$ was determined by the ratio of delivered electrical power, $V_{mp}I_{mp}$, to that of the sunlight incident upon the device.

As will now be apparent to those skilled in the art, certain modifications can be made to the above-described first embodiment of the present invention without departing from the scope or spirit of the invention. For example, because the existence of undoped first sublayer 240 between p-type layer 230 and boron-doped second sublayer 250 is of primary importance to the practice of the present invention, it is possible to attain most of the advantages of the present invention without including undoped third sublayer 260. In such a case, boron-doped second sublayer 250 would extend to the interface with n-type layer 270.

The thickness of first sublayer 240 can also be adjusted relative to second sublayer 250 to optimize the hole transport but still maintain an acceptable response to blue light. The general doping scheme described herein can be applied to similar devices with a wide range of i-type layer thicknesses.

FIG. 5 is a cross-sectional view of a n-i-p photovoltaic device 500 constructed in accordance with a second embodiment of the present invention. PV device 500 includes a transparent substrate 510, a transparent conductive layer 520, an n-type layer 530, and an i-type layer 535 consisting of an undoped first sublayer 540, a boron-doped second sublayer 550, and an undoped third sublayer 560. PV device 500 further includes a p-type layer 570 and a reflective conductive layer 580.

Transparent substrate 510 may be comprised of any material transparent to the radiation to which the PV device will be subjected, the preferred material being glass. Transparent conductive layer 520 is formed by coating a thin film of a transparent conductive oxide, such as tin oxide, on transparent substrate 510, in the same manner discussed above with respect to transparent conductive layer 220 (FIG. 2). N-type layer 530 is deposited on transparent conductive layer 520 using plasma-assisted chemical vapor deposition, in the same manner as discussed above with respect to n-type layer 270 (FIG. 2). N-type layer 530 may be formed of an hydrogenous amorphous silicon semiconductor compound including silicon and phosphorous. When the thickness of n-type layer 530 reaches approximately 120 Å the deposition of n-type layer 530 is completed and followed by a flush to eliminate phosphorous contamination.

The i-type layer 535 is deposited on n-type layer 530 using DC plasma-assisted chemical vapor deposition. The i-type layer 535 may be formed of any one of various compounds of amorphous silicon such as a-Si$_{1-x}$Ge$_x$:H or a-Si$_{1-x}$C$_x$:H, but is preferably formed of a-Si:H. To form i-type layer 535 of a-Si:H, SiH$_4$ is used as the source gas mixture. Undoped first sublayer 540 of i-type layer 535 is deposited on n-type layer 530 until it reaches a thickness between 500 to 1670 Å, at which point the plasma deposition is interrupted. Undoped first sublayer 540 is deposited in the same manner discussed above with respect to third sublayer 260 (FIG. 2).

To form boron-doped second sublayer 550, the plasma deposition is resumed and includes a low flow of a boron containing gas such as B$_2$H$_6$, BF$_3$, or, preferably, B(CH$_3$)$_3$, mixed with the source gas mixture for i-type layer 535. The flow of the boron containing gas may be varied during the deposition of boron-doped second sublayer 550 in order to produce a graded doping profile. However, it is preferred to maintain the flow of the boron containing gas constant. Second sublayer 550 is deposited in the same manner discussed above with respect to second sublayer 250. When boron-doped second sublayer 550 reaches a thickness in the range of 500 to 4000 Å, the plasma is turned off and followed by a long flush (approximately 20 min.) using the gas mixture to be used for the deposition of third sublayer 560. This flush eliminates the possibility of residual boron contamination in the deposition of the undoped third sublayer 560. The deposition of undoped third sublayer 560 is carried out in the same manner as discussed above with respect to first sublayer 240 (FIG. 2) and is stopped when the overall thickness of i-type layer 535 reaches approximately 5,000 Å.

After the completion of deposition of i-type layer 535, p-type layer 570 is deposited on the i-type layer using plasma-assisted chemical vapor deposition in the same manner discussed above with respect to p-type layer 230 (FIG. 2). Preferably, p-type layer 570 comprises SiC containing a uniform boron concentration on the order of $5 \times 10^{19}$ atoms/cm$^3$. Deposition of p-type layer 570 is complete when the thickness of p-type layer 570 is in the range of 100 to 120 Å.

After the deposition of p-type layer 570 is completed, reflective conductive layer 580 is deposited on p-type layer 570 in the same manner discussed above with respect to reflective conductive layer 280 (FIG. 2). Reflective conductive layer 580 comprises a dielectric/metal reflective material, such as ITO/Ag, and has a thickness of approximately 2000 Å.

As will be apparent to those skilled in the art, certain modifications can be made to the above-described second embodiment of the present invention without departing from the scope or spirit of the invention. For example, because the existence of undoped third sublayer 560 between p-type layer 570 and borondoped second sublayer 550 is of primary importance to the practice of the invention, it is possible to attain most of the advantages of the present invention without including undoped first sublayer 540. In such a case, boron-doped second sublayer 550 would be deposited directly on n-type layer 270.

The thickness of undoped third sublayer 560 can be adjusted relative to that of boron-doped second sublayer 550 in order to optimize the hole transport while maintaining an acceptable response to red light at the same time. The general doping scheme can be applied to devices with an i-type layer thickness ranging from 2000 Å to 10,000 Å.

Because the PV device of the present invention provides greater response to red light in the p-i-n configuration than prior art devices which do not include a doped i-type layer, it is desirable for use in a multijunction PV device, where the light entering the second or third junction would be mostly red.

FIG. 6 shows a cross-sectional view of a multijunction photovoltaic device 600 constructed in accordance with the present invention. PV device 600 includes a transparent substrate 610; a transparent conductive layer 620; a first PV cell 625 having a p-type layer 630, an i-type layer 640, and an n-type layer 650; a second PV cell 655 having a p-type layer 660, an i-type layer 670, and an n-type layer 680; a third PV cell 685 having a p-type layer 690, an i-type layer 695 consisting of an undoped first sublayer 700, a boron-doped second sublayer 710, and an undoped third sublayer 720, and n-type layer 730; and a reflective conductive layer 740.

Transparent substrate 610 and transparent conductive layer 620, are constructed in accordance with the first embodiment described above. First PV cell 625 incorporates, preferably, an i-type layer 640 with the highest energy bandgap effective to absorb the short wavelength light in the sun's spectrum (<630 nm). Second PV cell 655 is formed on first PV cell 625 and, preferably, incorporates an i-type layer 670, with a smaller bandgap, than that of layer 640, to absorb light the middle wavelength range (between 500-800 nm). Third PV cell 685 is formed on second PV cell 655 and preferably incorporates i-type layer 695 with the smallest bandgap to absorb light in the longest wavelength range. The structure of i-type layer 695 is preferably constructed in accordance with the first embodiment of the present invention because of its increased efficiency in the long wavelength range. Such an arrangement is preferred because such a multijunction PV device utilizes different ranges of the solar spectrum in the PV cells of which it is comprised, in the most effective manner. The structure used in the first embodiment can be also used in the second PV cell 655 to enhance its overall collection efficiency.

It is also possible to construct a multijunction PV device, in accordance with the present invention, having only two PV cells. In this case it would be preferable to construct the first PV cell in accordance with prior art PV cell exhibiting high efficiency in the short to middle wavelengths range, and to construct the second PV cell in accordance with the first embodiment of the present invention because of its increased efficiency in the middle to long wavelengths range.

A multijunction PV device can also be constructed using n-i-p PV cells. In such a device, all cells can be constructed in accordance with the second embodiment of the present invention because it enhances charge collection for all wavelengths.

Although the construction of a multijunction PV device in accordance with the present invention has only been described using two to three PV cells, the present invention is not limited to the number of cells employed. As will now be apparent to those skilled in the art, it is most important that the last cell be constructed in accordance with the present invention, in order to provide that cell with an increased efficiency in the long wavelength range.

The particular doping scheme is not limited to the use of boron as the dopant in the i-type layer, and is essentially applicable to any dopant which will achieve the same effect, namely enhancing hole transport at the expense of electron transport. Other possible dopants include Al, Ga, or other suitable group III elements.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:
1. A photovoltaic cell, comprising:
   a p-type layer of a semiconductor compound including silicon
   an i-type layer of a single amorphous semiconductor compound including silicon, said i-type layer including
      an undoped first sublayer formed on said p-type layer,
      a doped second sublayer doped with a p-type dopant and formed on said first sublayer, and
      an undoped third sublayer formed on said second sublayer; and
   an n-type layer of a semiconductor compound including silicon formed on said i-type layer.
2. The photovoltaic cell of claim 1, wherein said i-type layer comprises a-Si:H.
3. The photovoltaic cell of claim 1, wherein said i-type layer comprises a-Si$_{1-x}$Ge$_x$:H.
4. The photovoltaic cell of claim 1, wherein said i-type layer comprises a-Si$_{1-x}$C$_x$:H.
5. The photovoltaic cell of claim 1, wherein said p-type layer comprises SiC.
6. The photovoltaic cell of claim 5, wherein said p-type layer contains a uniform boron concentration of about $5 \times 10^{19}$ atoms/cm$^3$.
7. The photovoltaic cell of claim 1, wherein said p-type layer has a thickness of 100–120 Å, and said i-type layer has a thickness of approximately 5000 Å.
8. The photovoltaic cell of claim 1, wherein said doped second sublayer is doped with a material selected from the group consisting of boron, aluminum, and gallium.
9. The photovoltaic cell of claim 8, wherein said p-type dopant is boron.
10. The photovoltaic cell of claim 9, wherein the boron doping concentration in said second sublayer is no greater than 10 ppm.
11. The photovoltaic cell of claim 9, wherein the boron doping in said second sublayer is uniform.
12. The photovoltaic cell of claim 11, wherein the boron doping concentration in said second sublayer is no greater than 10 ppm.
13. The photovoltaic cell of claim 1, wherein said n-type layer has a thickness of 200–300 Å, and said i-type layer has a thickness of approximately 5000 Å.
14. A photovoltaic device, comprising:
   a transparent substrate;
   a transparent electrode formed on said transparent substrate;
   a p-type layer formed on said transparent electrode;
   an i-type layer of a single amorphous semiconductor compound including silicon formed on said p-type layer and including
      an undoped first sublayer formed on said p-type layer,
      a doped second sublayer formed on said first sublayer, and
      an undoped third sublayer formed on said second sublayer;
   an n-type layer formed on said third sublayer; and
   a reflective electrode layer formed on said n-type layer.
15. The photovoltaic device of claim 14, wherein said doped second sublayer is doped with boron.
16. A multijunction photovoltaic device, comprising:
   a transparent substrate;

a transparent electrode formed on said transparent substrate;

a first photovoltaic cell formed on said transparent electrode;

a second photovoltaic cell formed on said first photovoltaic cell and comprising, a p-type layer formed adjacent said first photovoltaic cell, an i-type layer of a single amorphous semiconductor compound including silicon formed on said p-type layer and including an undoped first sublayer formed on said p-type layer, a doped second sublayer formed on said first sublayer, and an undoped third sublayer formed on said second sublayer, and an n-type layer formed on said third sublayer; and a reflective electrode layer formed on said n-type layer.

17. The multijunction photovoltaic device of claim 16, wherein said doped second sublayer is doped with boron.

18. A multijunction photovoltaic device, comprising:

a transparent substrate;

a transparent electrode formed on said transparent substrate;

a first photovoltaic cell formed on said transparent electrode;

a second photovoltaic cell formed on said first photovoltaic cell;

a third photovoltaic cell formed on said second photovoltaic cell, said third photovoltaic cell including a p-type layer formed adjacent said second photovoltaic cell, an i-type layer of a single amorphous semiconductor compound including silicon formed on said p-type layer and including an undoped first sublayer formed on said p-type layer, a doped second sublayer formed on said first sublayer, and an undoped third sublayer formed on said second sublayer, and an n-type layer formed on said third sublayer; and a reflective electrode layer formed on said n-type layer.

19. The multijunction photovoltaic device of claim 18, wherein said doped second sublayer is doped with boron.

20. A photovoltaic device, comprising:

a transparent substrate;

a transparent electrode formed on said transparent substrate;

an n-type layer formed on said transparent electrode;

an i-type layer of a single amorphous semiconductor compound including silicon formed on said n-type layer, said i-type layer including an undoped first sublayer formed on said n-type layer, a doped second sublayer doped with a p-type dopant and formed on said first sublayer, and an undoped third sublayer formed on said second sublayer;

a p-type layer formed on said third sublayer; and a reflective electrode layer formed on said p-type layer.

21. The photovoltaic device of claim 20, wherein said p-type dopant is boron.

* * * * *